United States Patent
Nishijima

(10) Patent No.: US 7,315,933 B2
(45) Date of Patent: Jan. 1, 2008

(54) RE-CONFIGURABLE CIRCUIT AND CONFIGURATION SWITCHING METHOD

(75) Inventor: Seiichi Nishijima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 64 days.

(21) Appl. No.: 11/244,043

(22) Filed: Oct. 6, 2005

(65) Prior Publication Data

US 2006/0202715 A1    Sep. 14, 2006

(30) Foreign Application Priority Data

Mar. 10, 2005   (JP) ............................. 2005-067294

(51) Int. Cl.
  *G06F 15/00*   (2006.01)
(52) U.S. Cl. ........................... 712/10; 712/16; 712/42; 326/39
(58) Field of Classification Search .................. 326/38, 326/39; 716/16, 17; 712/10, 16, 42
  See application file for complete search history.

(56) References Cited

U.S. PATENT DOCUMENTS

| | | | |
|---|---|---|---|
| 5,869,979 A * | 2/1999 | Bocchino ..................... | 326/38 |
| 6,292,926 B1 | 9/2001 | Fukui et al. | |
| 6,768,337 B2 * | 7/2004 | Kohno et al. ................. | 326/41 |
| 2004/0267994 A1 | 12/2004 | Mathewson et al. | |
| 2005/0134308 A1 * | 6/2005 | Okada et al. .................. | 326/39 |
| 2006/0101232 A1 * | 5/2006 | Takada et al. ................. | 712/10 |
| 2006/0109027 A1 * | 5/2006 | Veredas-Ramirez .......... | 326/37 |
| 2006/0184912 A1 * | 8/2006 | Takano ......................... | 716/16 |
| 2006/0206696 A1 * | 9/2006 | Saito et al. ................... | 712/227 |
| 2007/0044065 A1 * | 2/2007 | Imafuku ....................... | 716/17 |

FOREIGN PATENT DOCUMENTS

| | | |
|---|---|---|
| EP | 0 798 633 A2 | 10/1997 |
| JP | 2002-076883 | 3/2002 |

OTHER PUBLICATIONS

John Hennessy et al, "Computer Architecture—A Quantitative Approach", San Mateo, Morgan Kaufmann, US, 1990, pp. 250-273, XP002297069, p. 3, Paragraph 1.

Andreas Münzner et al, "Converting Combinational Circuits Into Pipelined Data Paths", International Conference On Computer Aided Design, (ICCAD), Santa Clara, Nov. 11-14, 1991, Los Alamitos, IEEE, Comp, Soc, Press, vol. Conf. 9, Nov. 11, 1991, pp. 368-371, XP010023677, ISBN: 0-8186-2157-5.

(Continued)

*Primary Examiner*—Vibol Tan
(74) *Attorney, Agent, or Firm*—Arent Fox LLP

(57) ABSTRACT

The present invention is a re-configurable circuit capable of reducing latency by selecting a route for skipping the FF of an operation unit and outputting data to a connection destination operation unit if an accumulated process time is below an operation cycle allocated to the operation unit.

The operation unit comprises at least a selector, a flip-flop and an operator. In a program for generating configuration information for switching the configuration of the operation unit of the re-configurable circuit, the selector selects the use/non-use of the flip-flop, based on the configuration information and selector switching condition is reflected in the configuration information for determining whether to take a route for transferring data inputted to the selector to the operator or a route for transferring the data to the operator skipping the flip-flop.

8 Claims, 11 Drawing Sheets

OTHER PUBLICATIONS

Stefaan Note et al, "Combined Hardware Selection and Pipelining In High-Performance Data-Path Design", IEEE Transactions On Computer Aided Design of Integrated Circuits and Systems, IEEE Service Center, Piscataway, NJ, vol. 11, No. 4, Apr. 1, 1992, pp. 413-423, XP000268824, ISSN: 0278-0070; p. 417, right-hand col. —p. 421, left-hand col.

Stephan Brown et al, "FPGA and CPLD Architectures: A Tutorial", IEEE Design & Test of Computers, IEEE Service Center, New York, NY, vol. 13, No. 2, Jun. 1, 1996, pp. 42-57, XP000596695, ISSN: 0740-7474.

Carl Ebeling et al "Mapping Applications to the RaPiD Configurable Architecture", Annual IEEE Symposium On Field-Programmable Custom Computing Machines, 1997, pp. 106-115, XP002132822 p. 106, right-hand col., last paragraph—p. 107, left-hand col., paragraph 2; figure 1 p. 109, left-hand col., paragraph 2; figure 4.

Hideharu Amano et al "A Dynamically Adaptive Hardware On Dynamically Reconfigurable Processor", IEICE Transactions On Communications, Communications Society, Tokyo, JP, vol. E86-B, No. 12, Dec. 2003, pp. 3385-3391, XP001191542, ISSN: 0916-8516.

European Official Communication dated Aug. 2, 2007.

* cited by examiner

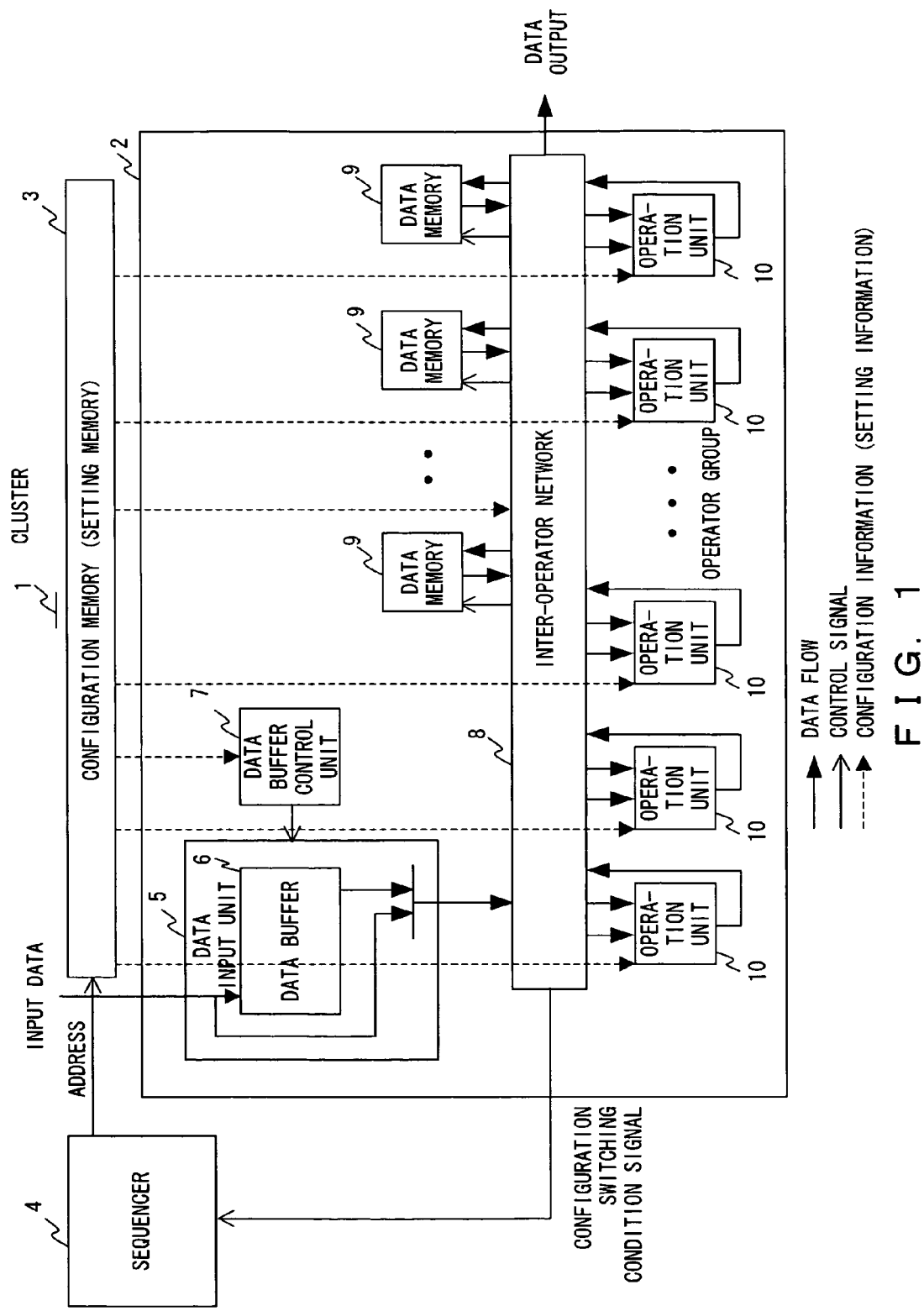
F I G. 1

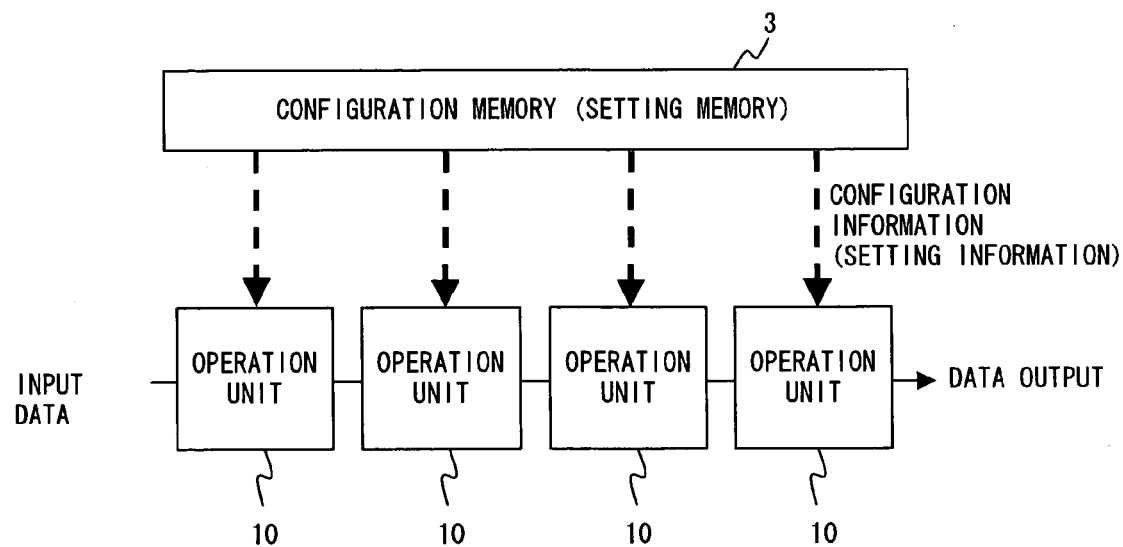
F I G. 2

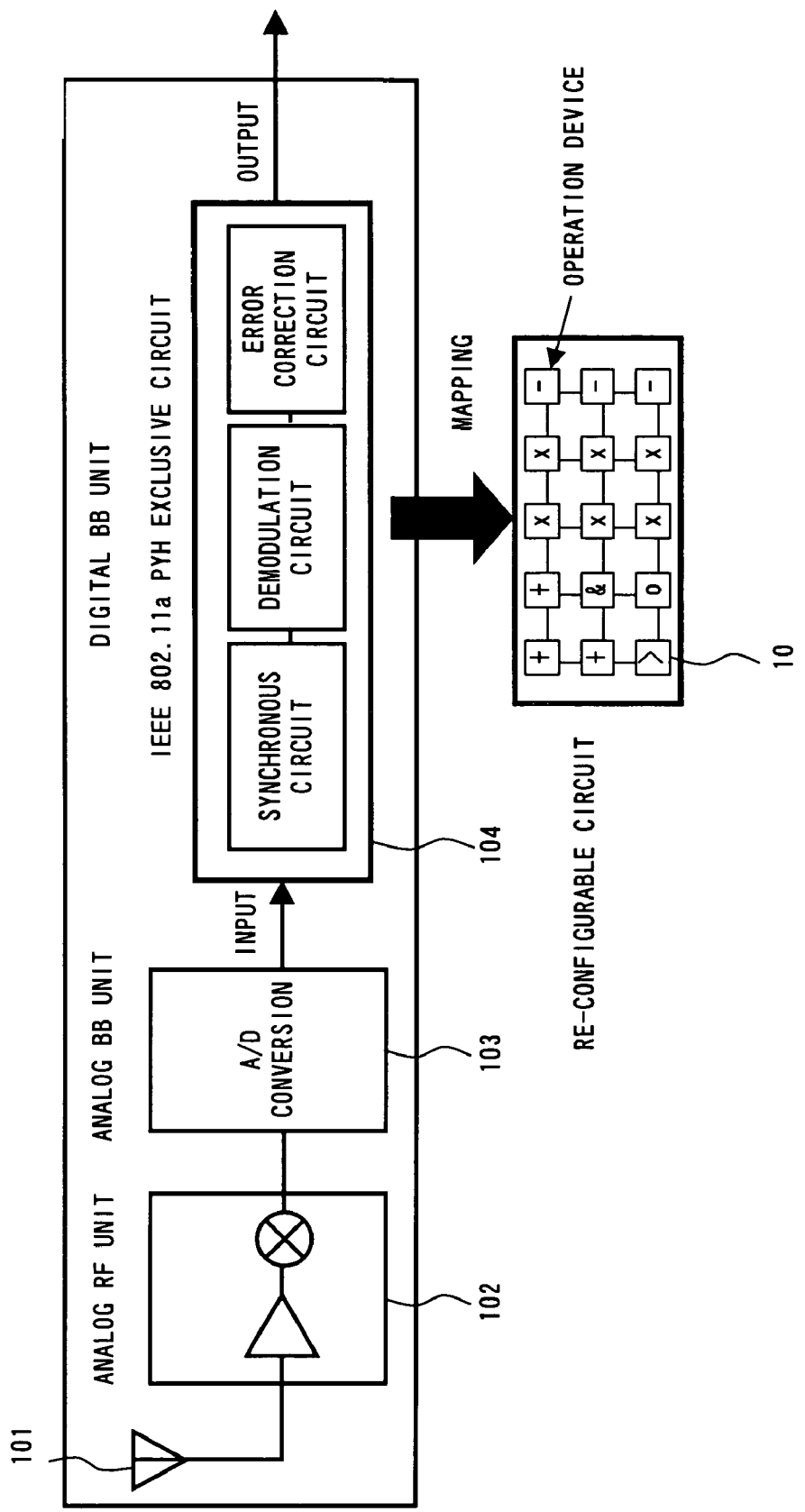
F I G. 3

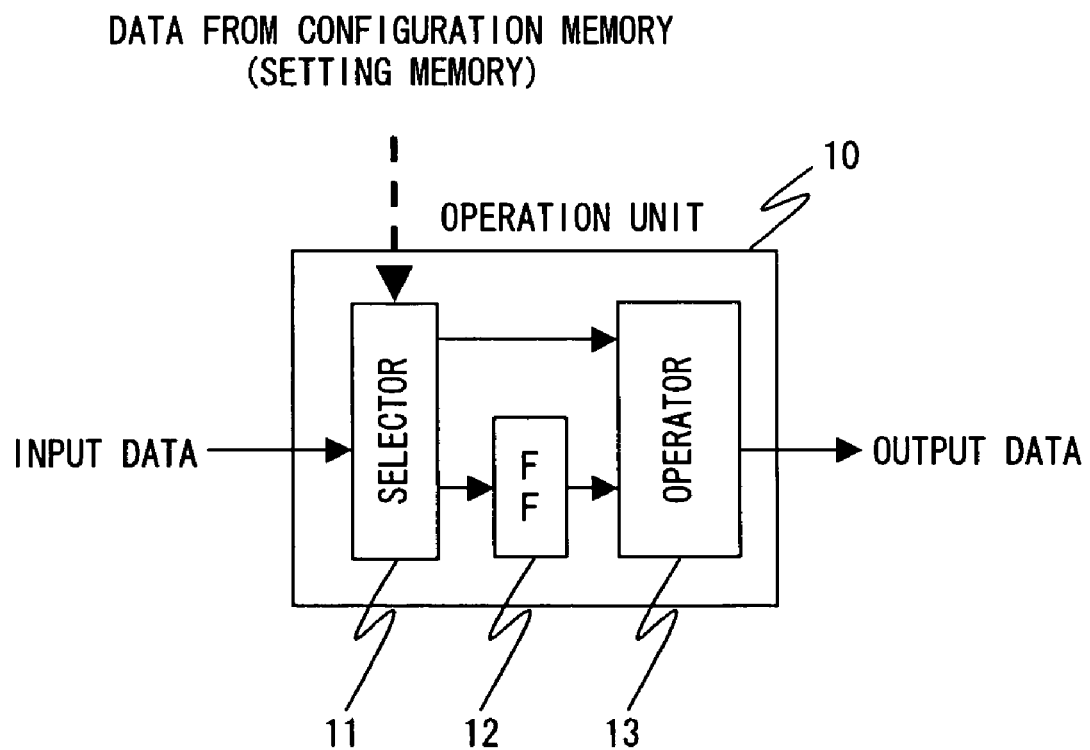
F I G. 5

RE-CONFIGURABLE CIRCUIT AND CONFIGURATION SWITCHING METHOD

CROSS-REFERENCE TO RELATED APPLICATIONS

This application is based upon and claims the benefit of priority from the prior Japanese Patent Application No. 2005-067294 filed on Mar. 10, 2005, the entire contents of which are incorporated herein by reference.

BACKGROUND OF THE INVENTION

1. Field of the Invention

The present invention relates to a re-configurable circuit capable of realizing a variety of functions programmably and more particularly relates to programmable mutual connection configuration technology suitable for a data path in an operation unit.

2. Description of the Related Art

Today a re-configurable circuit whose hardware can be re-configured by a program is proposed. Generally the re-configurable circuit has a structure in which a plurality of so-called operation units for processing data is provided in an array.

FIG. 1 shows an example of the configuration of a re-configurable circuit. The re-configurable circuit comprises a plurality of clusters, which are connected by, for example, a crossbar switch or the like and enables the data transfer between the clusters. One cluster comprises an ALU array unit (operator group 2). The ALU array unit comprises a plurality of operation units. The operation unit 10 usually comprises an ALU, a multiplier and the like.

The cluster 1 comprises an operator group 2 (ALU array unit), configuration memory 3 (setting memory) and a sequencer 4.

The operator group 2 comprises a data input unit 5, a data buffer unit 6, a data buffer control unit 7, an inter-operator network 8, data memory 9 and operation units 10.

The data input unit 5 supplies externally inputted data to the data memory 9, each operation unit 10 and the like via the inter-operator network 8. For example, the data input unit 5 comprises the data buffer unit 6. In this case, the data buffer unit 6 selects the buffering/non-buffering of externally inputted data by a control signal from the data buffer control unit 7. The data buffer control unit 7. The data buffer control unit 7 receives configuration information from the configuration memory 3, transmits a control signal to the data buffer unit 6 as the control signal according to the information, and selects the buffering/non-buffering of the input data.

The inter-operator network 8 is mutually connected with a variety of components (such as the data input unit 5, data memory 9, operation unit 10 and the like). The inter-operator network 8 enables the data transfer between a variety of components connected to the inter-operator network 8 according to configuration information generated based on externally supplied configuration data (data generated by compiling a program). The data memory 9 records data via the inter-operator network 8. The operation unit 10 is set so as to perform a function related to configuration information by the configuration information.

The configuration memory 3 loads configuration data onto the configuration memory 3 from an external storage device for storing configuration data, which is not shown In FIG. 1, such as a PC or the like (for example, loads using the communication means of the PC). The configuration memory 3 comprises a configuration data loading unit, which is not shown in FIG. 1, and generates/outputs a configuration switching condition signal based on a condition establishing signal (such as a chip-select signal) mainly transmitted from the operation unit 10 of a variety of re-configurable components constituting the operator group 2. For example, the configuration switching condition signal is generated based on the condition establishing signal and configuration data from the configuration memory 3. The sequencer 4 generates the address of the configuration information to be subsequently read by the configuration data based on the switching condition signal.

FIG. 2 shows the configurations of the configuration memory 3 and operation unit 10 of the re-configurable circuit. Next, the data processing of the operation unit 10 is described below.

In order to set each operation unit 10, configuration information is transferred from the configuration memory 3 to each operation unit 10, and each operation unit 10 is set. At this moment, the configuration information also controls connection switching between operation units 10 to set the input data path of each operation unit 10.

According to Patent reference 1, in a re-configurable device having a programmable mutual connecting network suitable for a data path, both input/output of signal transmission between a function cell (for setting a variety of logic functions programmably) and a long-haul horizontal programmable mutual connection channel are performed via a short-haul horizontal programmable mutual connection channel and a programmable switch. By such a configuration, the load of the long-haul horizontal programmable mutual connection channel can be reduced to realize high-speed transmission. A re-configurable device high-speed programmable mutual connecting network which secures sufficient routability using few switching and wiring and especially in which a multi-bit data path can be efficiently implemented is proposed.

However, in a system using a re-configurable circuit in which a plurality of operation units 10 are provided in an array, for example, in the case of the wireless LAN receiving unit shown in FIG. 3, an analog radio frequency (RF) unit 103 down-converts a signal received from an antenna 101 in order to demodulate it, an analog baseband (BB) unit 103 A/D converts it and a digital BB unit 104 demodulate it. In this case, in order to realize the IEEE802.11a PHY exclusive circuit of the digital BB unit 104 by a re-configurable circuit, a latency condition must be severe in rating. Therefore, sometimes a wireless LAN process cannot be realized in a re-configurable circuit.

Such a problem is caused by the data transfer speed (operation cycle) between operation units 10. For example, in a structure where a plurality of operation units 10 are provided in an array, it depends on the data transfer speed from the first-stage operation unit 10 (operation unit 10 for receiving input data) to the most remote operation unit 10 (operation unit 10 for outputting data). In other words, as the number of operation units 10 for performing the operation process increases, its transfer speed decreases.

The operation unit 10 includes a predetermined process delay (FF12: flip-flop). This process delay is always fixed regardless of the complexity (multiplication, addition, AND (logical product), OR (logical sum) and the like) of a command given to the operation unit 10. Therefore, even if it is the repetition of any simple process, its latency (the number of steps of FFs used until the process is completed after data is inputted) increases at every process of the operation unit 10.

The re-configurable circuit on which three operation units 10 are mapped as shown in FIG. 4 is described as an example. Since a FF12 is permanently provided for the interface of the operation unit 10, process delay for three clocks always occurs. This has no relation to the contents of an operation process performed by the operation unit 10 and process delay increases as the number of operation units 10 increases.

In Patent reference 1, although input/output signals are transmitted between the operation unit 10 and a long-haul horizontal programmable mutual connection channel via a short-haul horizontal programmable mutual connection channel and a programmable switch, there is no special description for a mapping method for improving the process speed of the operation unit.

Patent reference 1: Japanese Patent Application No. 2002-76883

SUMMARY OF THE INVENTION

In the present invention, if a command allocated to the operation unit is processed within an operation cycle, the command is outputted to a connection destination operation unit without going through the FF of the operation unit. Thus, since the FF is used if necessary, its latency is reduced.

Furthermore, if the command of the connection destination operation unit is consecutively processed within the operation cycle, its latency can be minimized by skipping the FF of the connection destination operation unit. By grouping a plurality of operation units and using a FF for communication between groups when exchanging data between groups, a re-configurable circuit for improving the data transfer speed (operation cycle) of the operation unit group can also be provided.

One aspect of the present invention is an operation unit in a re-configurable circuit provided with a plurality of operation units, capable of realizing a variety of functions by re-configuring the plurality of operation units, according to configuration information. The operation unit comprises an operator for applying an operation process to data inputted to the operation unit, a flip-flop for delaying the transfer of the input data to the operator and a selector for switching between a route for transferring the input data to the operator via the flip-flop and a route for transferring the input data to the operator skipping the flip-flop. The routes are switched according to the selector switching condition setting information. The selector can be switched by a crossbar switch.

Another aspect of the present invention is a re-configurable circuit provided with a plurality of operation units, capable of realizing a variety of functions by re-configuring the plurality of operation units, according to configuration information. The re-configurable circuit comprises an operator for applying an operation process to data inputted to the operation unit and a flip-flop for delaying the transfer of the input data to the operator. A selector for switching between a route for transferring the input data to the operator via the flip-flop and a route for transferring the input data to the operator skipping the flip-flop is provided outside the operation unit, and the selector switches the routes, according to the selector switching condition setting information contained in the configuration information.

In such configurations, by using a selector, a path without going through the FF can be selected, thereby reducing latency.

Another aspect of the present invention is an operation unit configuration switching method in a re-configurable circuit provided with a plurality of operation units, capable of realizing a variety of functions by re-configuring the plurality of operation units, according to configuration information. In the method, a switching condition setting for switching between a route for a selector provided for the operation unit transferring data inputted to the operation unit to an operator provided for the operation unit via a flip-flop provided for the operation unit and a route the data to the operator skipping the flip-flop is reflected in configuration information, and the routes are switched by-controlling the selector.

In the selector switching condition setting, an operation process time corresponding to the operation contents of the operation unit is calculated according to information about operation contents for setting the operation process contents of each of the plurality of operation units and information about connection contents in order to perform an operation process, an operation unit to be firstly connected is selected based on the connection contents between the operation units, an accumulated process time is calculated based on the operation process time of the operation unit in connection order starting from the first operation unit, and the accumulated process time is compared with the predetermined operation cycle. If the accumulated process time is below the operation cycle, a route is set so as not to use the flip-flop. If it exceeds the operation cycle, it is set so as to use the flip-flop, and also the accumulated process time is set to the operation process time of the currently selected operation unit.

The operation process time is calculated in relation to the number of wires connected to the operation unit. Preferably the operation process time can include time caused by temperature fluctuations.

If a command allocated to the operation unit is processed within the process time of an operation frequency (for example, within one clock), the command is outputted to the connection destination operation unit skipping the FF of the operation unit. If the command of the connection destination operation unit is consecutively processed within the operation cycle (for example, within one clock), the command also skips the FF of the connection destination operation unit. By predetermining a process time for each operation process (command), the data transfer speed (operation frequency) of the operation unit group of the re-configurable circuit can be improved. In this case, there is no need to always use the FF of the operation unit, thereby reducing latency.

Furthermore, if the sum of the operation process times of the operation units is below a predetermined operation cycle when the operation units each with a switching unit for performing the switching are connected according to the configuration information, the re-configurable circuit, being one aspect of the present invention comprises a flip-flop for communication at the output of the group and a communication unit for transferring data via the flip-flop for communication when transferring data between the groups.

By such a configuration, by grouping several operation units and using a FF for communication between groups when exchanging data between groups, the data transfer speed (operation frequency) of the operation unit group can be improved.

According to the present invention, the data transfer speed (operation frequency) of the operation unit group of the re-configurable circuit can be improved, and since there is no need to always use the FF of the operation unit, latency can be reduced.

BRIEF DESCRIPTION OF THE DRAWINGS

FIG. 1 shows the configuration of a cluster.

FIG. 2 shows the major part of the present invention in the configuration of a cluster.

FIG. 3 shows a circuit in which a re-configurable circuit is applied to a wireless LAN device.

FIG. 5 shows the configuration of the operation unit of the present invention.

DESCRIPTION OF THE PREFERRED EMBODIMENTS

The preferred embodiments of the present invention are described in detail below with reference to the drawings.

The First Preferred Embodiment

FIG. 5 shows the internal configuration of the operation unit 10 of the present invention. The operation unit 10 receives input data via a selector 11. The selector 11 switches, according to switching condition setting information contained in configuration information transferred from configuration memory (setting memory) 3 to select between passing the input data through an FF 12 and skipping the FF 12. In this case, the input data is data externally inputted to the operation unit 10, such as the operation result of another operation unit, a signal externally inputted from an integrate circuit provided with a re-configurable circuit or the like. Then, the input data is inputted to an operator 13 and outputted after being operated. In this case, the operator 13 operates using a combinatorial circuit or a sequential circuit. For example, the operator 13 performs operations, such as addition, multiplication, logical OR, logical AND and the like.

Figure 4:
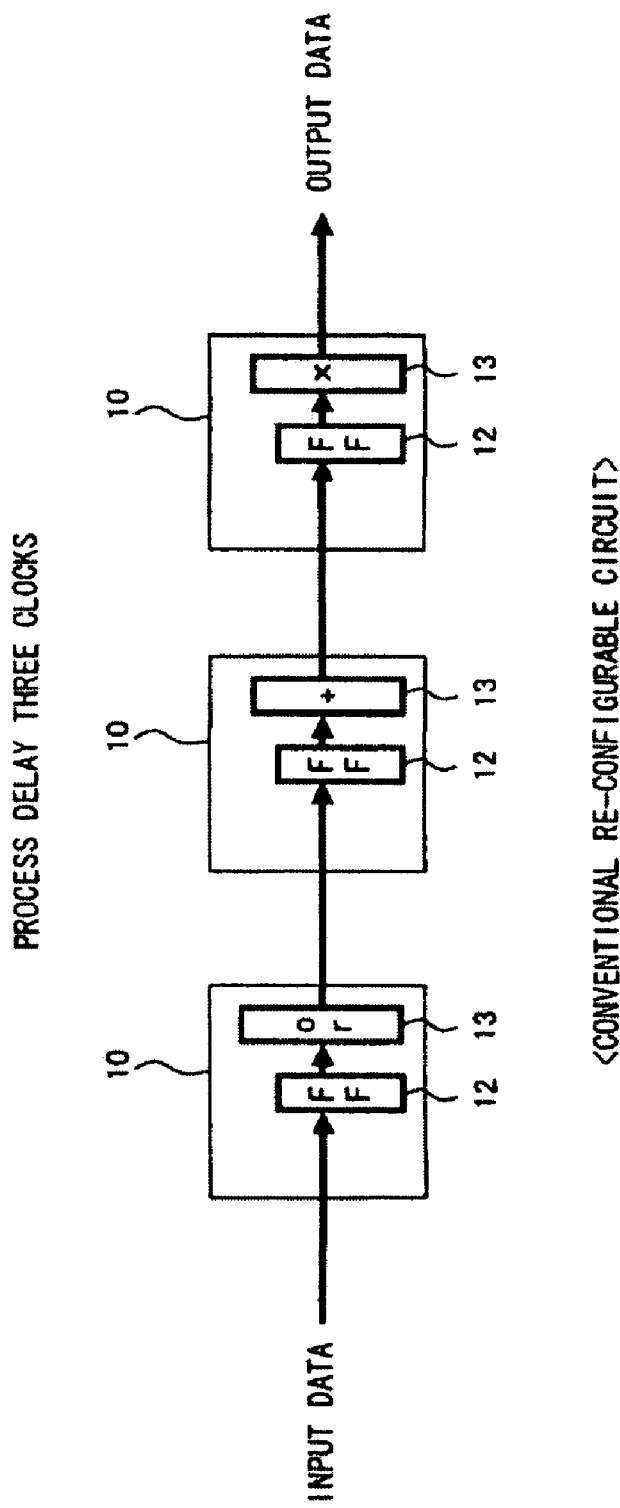
FIG. 4 shows the conventional re-configurable circuit (process delay: three clocks).
Figure 6:
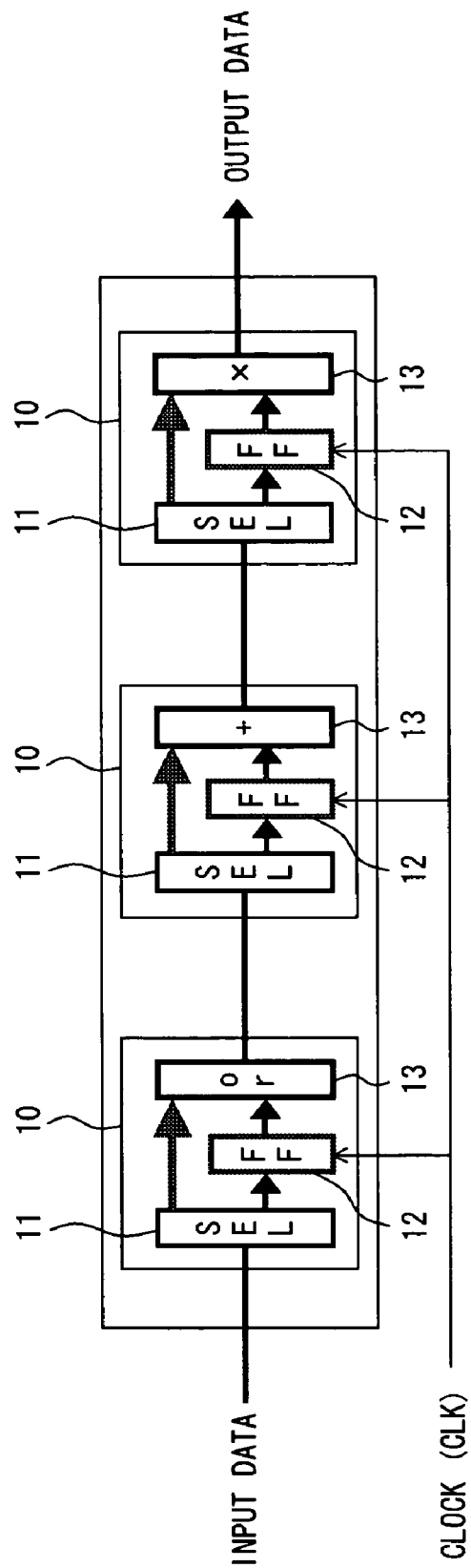
FIG. 6 shows the operation unit connection of the present invention.

In FIG. 6, the operation units 10 each with the selector 11 are mapped in the configuration of FIG. 4. In the configuration of FIG. 6, an operation unit 10 to be used is determined according to switching condition setting information contained in configuration information, the connection of each operation unit 10 is determined and the selector 11 is switched.

Figure 7:
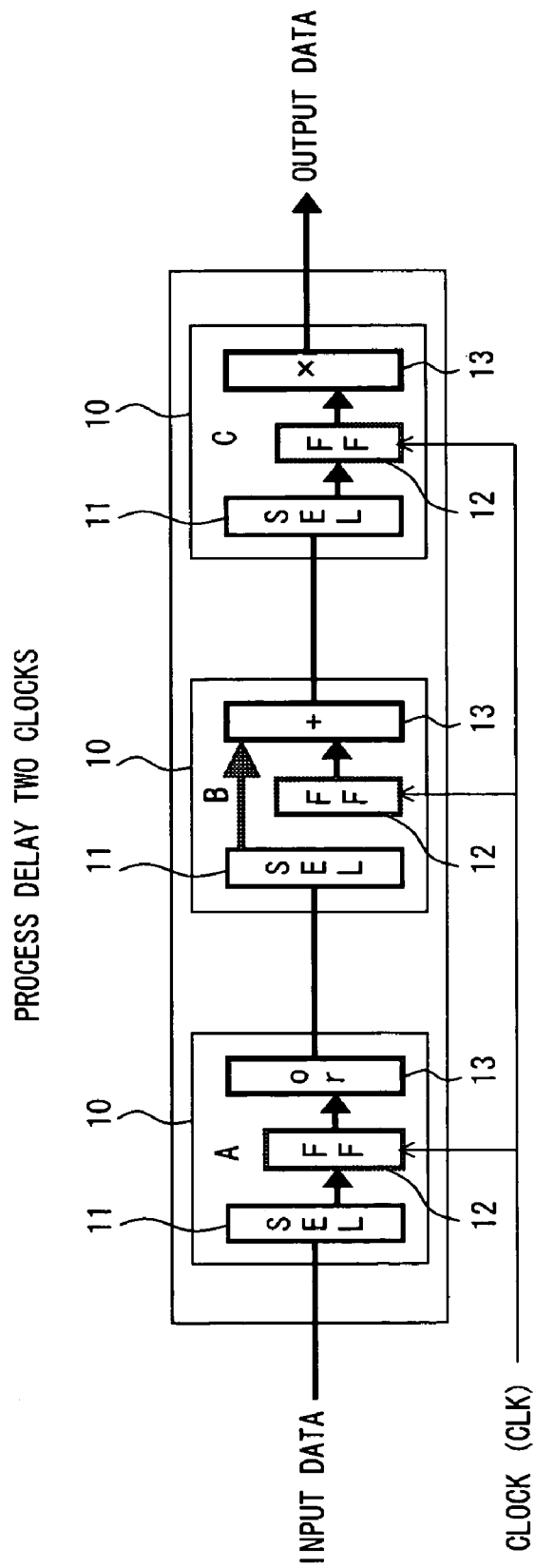
FIG. 7 shows a process not using an FF (process delay: two clocks).

In FIG. 7, if a process time between "or" (operation unit: A) and "+" (operation unit 10: B) is below an operation cycle, the selector 11 at the second stage (operation unit 10: B) is switched to skip the FF. By such a configuration, the conventional three clocks can be reduced to two clocks. It is OK if the selector 11 can be switched according to switching condition setting information contained in configuration information.

The Second Preferred Embodiment

Figure 8:
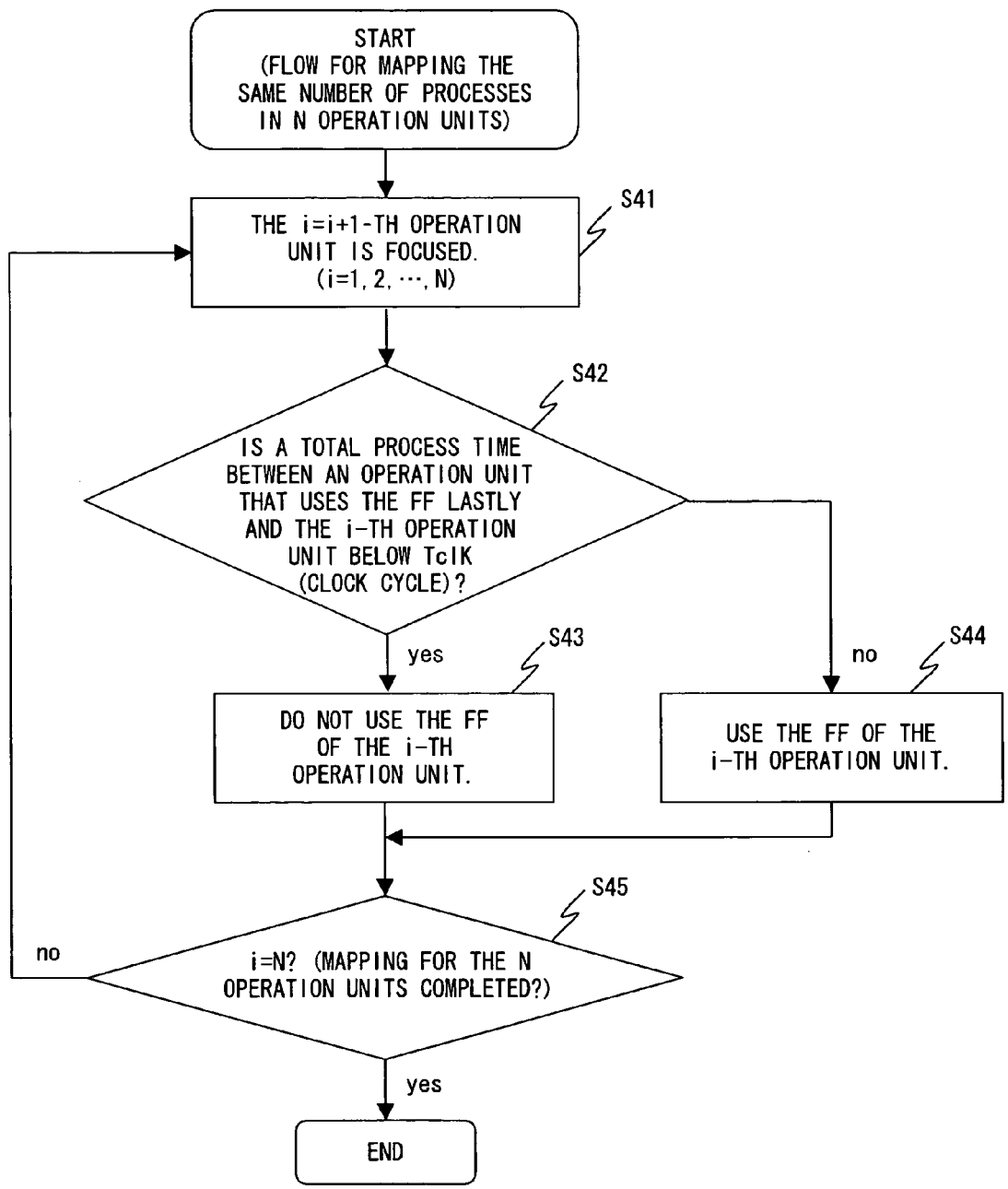
FIG. 8 is the flowchart of the selector switching method of the first preferred embodiment.
Figure 9:
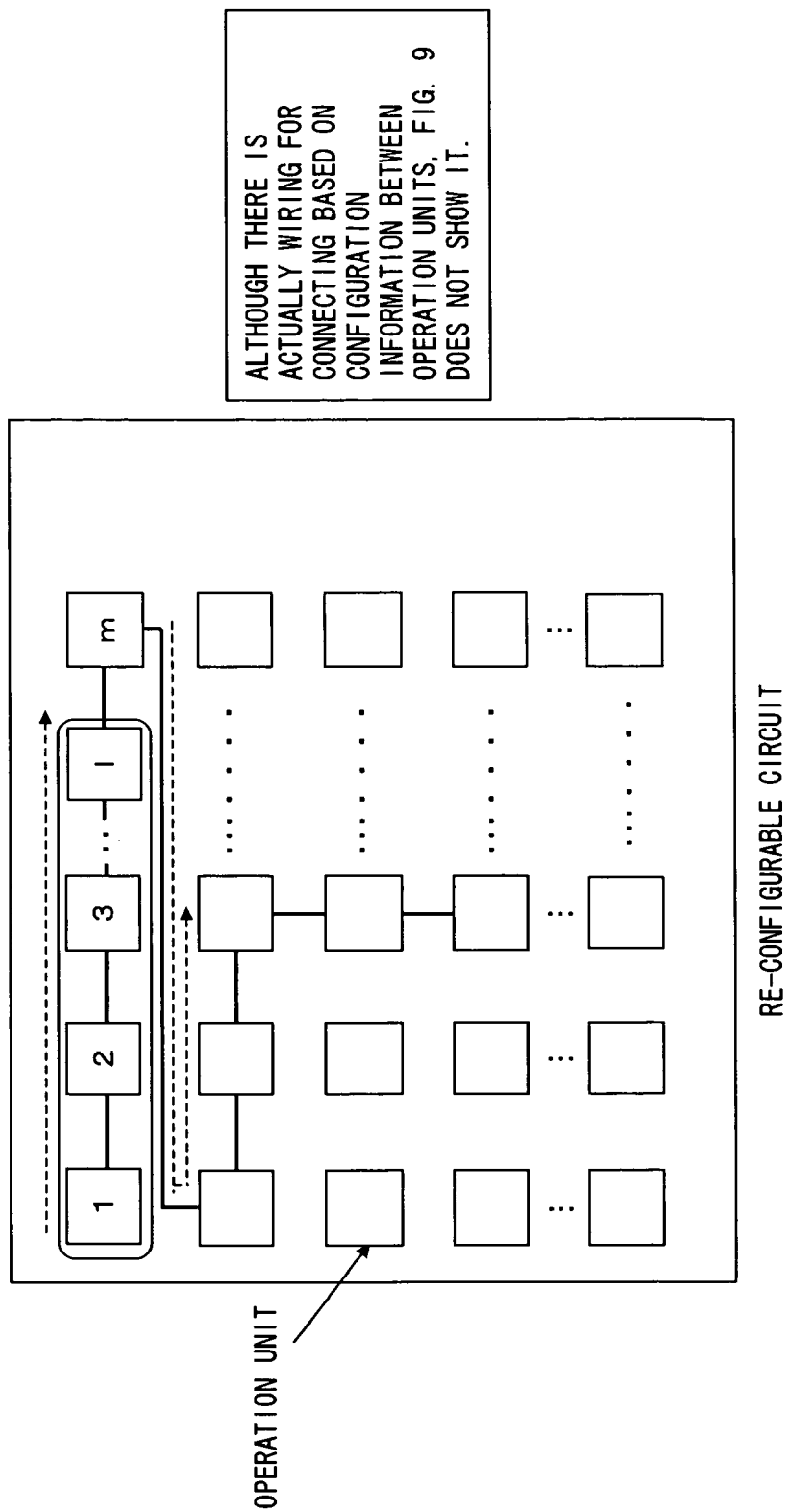
FIG. 9 shows the basic configuration of the re-configurable circuit for explaining the flowchart of the selector switching method of the first preferred embodiment.

The switching method of the selector 11 describe in the first preferred embodiment is described below. In order to generate switching condition setting information contained in configuration information, the contents (addition, multiplication, logical OR, logical AND or the like) of the operation process of the operation unit and connection between operation units (inter-operator network 8) are determined. For example, assuming that each operation unit is mapped as shown in FIG. 9, the mapping method of the switching process contents of the selector 11 of the operation unit is described according to he flowchart shown in FIG. 8 (although actually there is wiring for connection according to configuration information between operation units, it is not shown in FIG. 9).

In step S41, N operation units 10 to be mapped are selected, and a number, such as 1 or the like is attached to an operation unit 10 to which data is inputted. The number is attached by a counter function or the like. When the selector of the first operation unit 10 is switched, i=1 is set and stored. When the selector of a subsequent operation unit 10 is switched, the subsequent operation unit is selected by incrementing the variable i of a counter to i=i+1 after completing steps up to a determination process S46, which is described later.

In step S42, an accumulated process time up to the i-th operation unit is calculated and is compared with a predetermined comparison process time. The summing of process times is described below with reference to FIG. 9. In a plurality of operation units (N), it is assumed that operation unit 1 is an operation unit in the case of i=1. The operation process time of operation unit 1 is calculated based on an operation process time corresponding to a prepared operation process.

For example, a correspondence table (table, operation expression) in which addition, multiplication, logical OR and logical AND correspond to A, B, C and D nsec, respectively. If the command of operation unit 1 is addition, A nsec is stored. Then, if in i=2, the command of operation unit 2 is multiplication, B nsec is stored, and an accumulated process time (A+B), being the sum of the operation process time A nsec of operation unit 1 and the operation process time B nsec of operation unit 2, is calculated, and the accumulated process time is assigned to a variable "sum".

Then, "sum" (accumulated process time: total value) obtained by summing operation process times is compared with the comparison process time. The comparison process time sets an operation cycle (Tclk) In this case, the operation cycle is a system clock cycle. However, a cycle other than the system clock cycle can also be used. Then, if the accumulated process time is below the comparison process time, the process proceeds to step S43 (yes). Otherwise, the process in step S44 (no) is performed.

In step S43, the selector 11 of an operation unit indicated by variable i is switched to a route not using the FF 12.

In step S44, the selector 11 of an operation unit indicated by variable I is switched to a route using the FF 12.

In step S45, it is checked whether all the switching of the selectors 11 of the operation units 1-N is completed. If all the selectors 11 of the N operation units are not switched, the process returns to step S41 and the processes are continued until all the selectors 11 of the N operation units are switched.

In FIG. 9, when all the operation process times of operation units 1-l are summed and the accumulated process time is compared with the predetermined comparison process time (Tclk), the accumulated process time exceeds the comparison process time. Therefore, The FF 12 of operation unit 1 is used. Then, a subsequent operation unit m is selected, and in step S41 i=m is set. In step S42, the operation process time of operation unit m is selected from the correspondence table and is assigned to "sum". Then, the comparison process time and the accumulated process time (sum=only the operation process time of operation unit m) are compared, and it is determined whether the FF is used. If the selector settings of all the operation units are completed, the process terminates.

As described above, information about selector switching can be reflected in configuration information by a program.

The Third Preferred Embodiment

Figure 10:
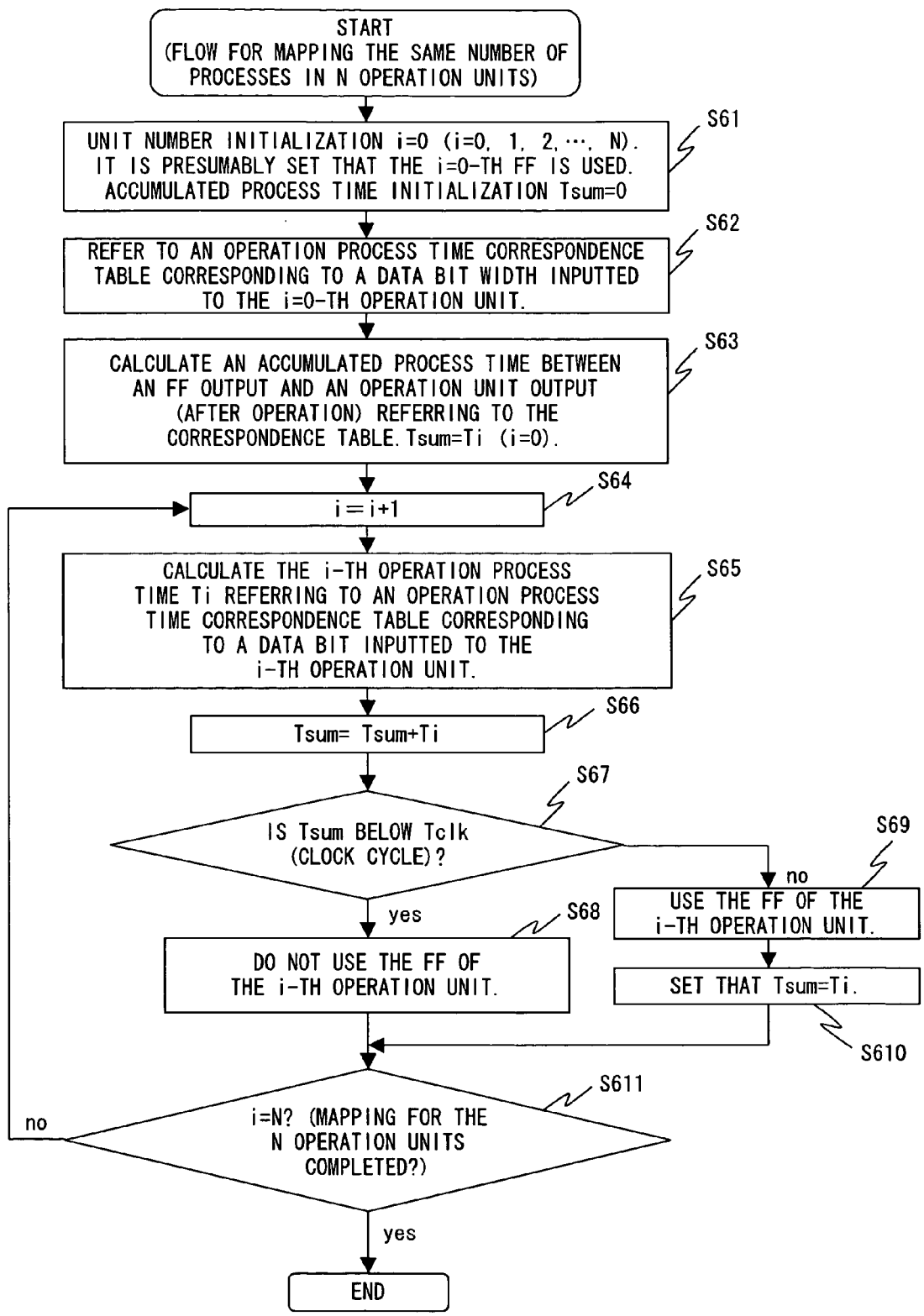
FIG. 10 is the flowchart of the selector switching method of the second preferred embodiment.

The selector switching method described in the first preferred embodiment is described with reference to FIG. 10. In order to generate switching condition setting information contained configuration information, the contents (addition, multiplication, logical OR, logical AND or the like) of the operation process of the operation unit and connection between operation units (inter-operator network) are determined.

In step S61, the number i allocated to the operation unit is initialized and i=0 is set. In this case, i corresponds operation units 0-N. It is assumed that the FF 12 of the i=0-th operation unit is used. The accumulated process time is initialized and Tsum=0 is set.

In step S62, an operation process time correspondence table corresponding to a data bit width inputted to the i=0-th operation unit is referenced. In this case, the operation process time correspondence table is a table (calculation expression) in which a process time is set for each one-bit width. For example, a correspondence table (operation expression) in which addition, multiplication, logical OR and logical AND correspond to A, B, C and D nsec, respectively, is prepared. Furthermore, in the case of addition, 10 nsec is set for the operation of one bit width, 20 nsec is set for the operation of two bit width and X nsec is set for the operation of N bit width.

In step S63, an accumulated process time between the output of the FF of the operation unit and the output of the operation unit (after operation) is calculated based on the operation process time correspondence table, and Tsum=Ti (i=0) is set.

In step S64, i is incremented, and i=i+1 is set. Then, a subsequent operation unit is selected.

In step S65, an operation process time correspondence table corresponding to a data bit width inputted to the i-th operation unit is referenced, and the i-th operation process time Ti is calculated.

In step S66, the i-th operation process time of the currently selected operation unit is added to the accumulated process time, and Tsum=Tsum+Ti is set.

In step S67, Tsum (total value) obtained by summing the accumulated process times and the comparison process time are compared. The comparison process time presets an operation cycle (Tclk). In this case, the operation cycle is a system clock cycle. However, a cycle other than the system clock cycle can also be used.

Then, if the total value is below the comparison process time, the process proceeds to step S68(yes). Otherwise, the process in step S69 (no) is performed.

In step S68, the switching of the selector 11 of an operation unit indicated by variable i is set so as not to use the FF 12.

In step S69, the switching of the selector 11 of an operation unit indicated by variable i is set so as to use the FF 12. In step S610, the current accumulated process time Tsum is discarded, and the operation process time Ti of the current operation unit is assigned to Tsum.

In step S611, it is checked whether the switching of all the selectors 11 of the operation units 1-N is completed. If the switch setting of all the selectors 11 of the N operation units is not completed, the process returns to step S64 and the processes are continued until the setting of all the selectors 11 of the N operation units is completed.

By the above-described program, selector switching information can be reflected in configuration information.

When calculating the operation process time of an operation unit, the delay time of an operation process due to temperature can also be added besides time data for a bit width.

If one operation unit is connected to a plurality of operation units, in other words if two or more routes exist, by using the above-described program, selector switching can also be reflected in configuration data.

Furthermore, the connection of the selector 11 for switching the FF 12 of the operation unit can be modified by using a crossbar switch. Therefore, the selector 11 can also be provided outside the operation unit 10.

In this case, the program used in the present invention (program shown in the flowchart of FIG. 8 or 10) can be executed by supplying it from memory, such as a ROM and a RAM, an external storage device and a portable storage device recording its program code to a computer (such as a personal computer, etc.) and making the computer read and execute the program code.

In this case, the program code read from the storage medium can realize the new function of the present invention, and the portable storage medium on which the program code is recorded or the like also constitutes the present invention. For the portable storage medium for providing the program code, a floppy (registered trademark) disk, a hard disk, an optical disk, a magneto-optical disk, a CD-ROM, a CD-R, a DVD-ROM, a DVD-RAM, a magnetic tape, a non-volatile memory card, a ROM card, variety of storage media on which the program code is recorded via a network connection device, such as electronic mail, personal computer communication or the like, (in other words, a communication line) can be used.

In addition to enabling a computer to execute a program code that the computer reads onto memory, the functions of the above-described preferred embodiments can also be realized by enabling an OS operating on the computer to execute a part of the actual process or the entire process, according to the instruction of the program code.

Furthermore, the functions of the above-described preferred embodiments can also be realized by enabling a CPU or the like provided for a function extension board inserted in a computer or a function extension unit connected to a computer to execute a part of the actual process or the entire process, according to the instruction of a program code after the program code read from a portable storage medium is written onto memory provided for the function extension board or the function extension unit.

The configuration information generated based on the program is stored in the appropriate area of configuration memory 3 by the communication means of the computer.

(Variation)

Figure 11:
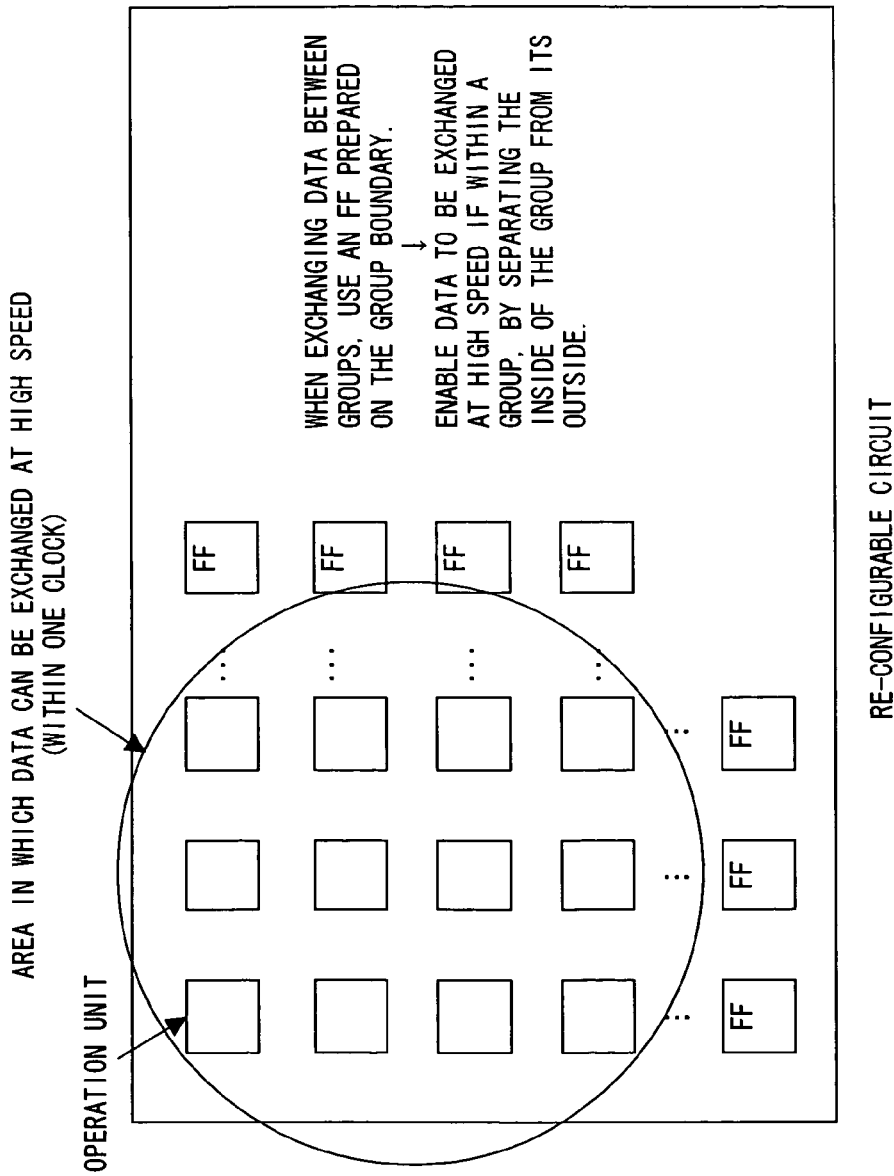
FIG. 11 shows the basic configuration of the re-configurable circuit in the case where data is exchanged between groups.

FIG. 11 shows the basic configuration of the re-configurable circuit of the present invention, in which operation units are mapped. The operation unit represents an encircled area (group) in which data can be exchanged in high speed.

For example, it represents a range in which the process can be completed within one clock.

If such a group operates together with another group requiring a high-speed process (if data is exchanged between groups), the operation process in the group can be stably performed at high speed, by disposing an FF for group communication in the neighborhood of a group boundary as shown in FIG. 11.

The application of the present invention is not limited the above-described preferred embodiments, and a variety of improvements and modifications are possible as long as the subject matter of the present invention is not deviated.

What is claimed is:

1. An operation unit in a re-configurable circuit provided with a plurality of operation units, capable of realizing a variety of functions by re-configuring the plurality of operation units, according to configuration information, comprising:
    an operator for applying an operation process to data inputted to the operation unit;
    a flip-flop for delaying the transfer of the data inputted to the operator; and
    a selector for switching between a first route for transferring the data inputted to the operator via the flip-flop and a second route for transferring the data inputted to the operator skipping the flip-flop, wherein
    the selector switches between the first route and the second route according to the selector switching condition setting information contained in the configuration information.

2. The operation unit constituting a re-configurable circuit according to claim 1, wherein the selector includes a crossbar switch.

3. A re-configurable circuit provided with a plurality of operation units, capable of realizing a variety of functions by re-configuring the plurality of operation units, according to configuration information, comprising:
    an operator for applying an operation process to data inputted to the operation unit; and
    a flip-flop for delaying the transfer of the data inputted to the operator, and comprising a selector for switching between a route for transferring the data inputted to the operator via the flip-flop and a route for transferring the data inputted to the operator skipping the flip-flop, the selector switches the routes, according to the selector switching condition setting information contained in configuration information.

4. An operation-unit configuration switching method of the re-configurable circuit provided with a plurality of operation units, capable of realizing a variety of functions according to claim 1, in which a switching condition that a selector provided for the operation unit switches between a route for transferring the input data to the operator via the flip-flop and a route for transferring the input data to the operator skipping the flip-flop is reflected in configuration information, and the selector is controlled to switch the routes, based on the switching condition reflected in the configuration information.

5. The operation-unit configuration switching method according to claim 4, wherein using the selector switching condition, an operation process time corresponding to operation contents of the operation unit is calculated according to information about the operation contents for setting operation process contents of each of the plurality of operation units and information about connection contents, an operation unit to be firstly connected is selected based on the connection contents between the operation units, and an accumulated process time is calculated based on the operation process time of the operation unit in connection order starting with the first operation unit, every time calculating the accumulated process time, the accumulated process time is compared with a predetermined operation cycle, a route is set so as not to use the flip-flop if the accumulated process time is below the operation cycle, a route is set so as to use the flip-flop if the accumulated process time exceeds the operation cycle, and the accumulated time is set to the operation process time of the currently selected operation unit.

6. The operation-unit configuration switching method according to claim 5, wherein the operation process time is calculated in relation to the number of wires connected to the operation unit.

7. A re-configurable circuit according to claim 3, further comprising a communication unit provided with a flip-flop for communication at an output of a group when transferring data between groups if a sum of operation process times of the operation units is below the predetermined operation cycle when connecting the operation units provided with a switching unit for performing the switching, based on the configuration information, for transferring data via the flip-flop for communication.

8. The operation-unit configuration switching method according to claim 5, wherein the operation process time includes time caused by temperature fluctuations.

* * * * *